(12) United States Patent
Hallot

(10) Patent No.: US 12,385,864 B2
(45) Date of Patent: Aug. 12, 2025

(54) METHOD FOR DETERMINING THE LINEAR AC ELECTRICAL RESISTANCE OF A STEEL PIPE AND DEVICE FOR IMPLEMENTING SUCH A METHOD

(71) Applicant: SAIPEM S.A., Montigny le Bretonneux (FR)

(72) Inventor: Raymond Hallot, Voisins le Bretonneux (FR)

(73) Assignee: SAIPEM S.A., Montigny le Bretonneux (FR)

( * ) Notice: Subject to any disclaimer, the term of this patent is extended or adjusted under 35 U.S.C. 154(b) by 207 days.

(21) Appl. No.: 18/030,842

(22) PCT Filed: Oct. 7, 2021

(86) PCT No.: PCT/FR2021/051737
§ 371 (c)(1),
(2) Date: Apr. 7, 2023

(87) PCT Pub. No.: WO2022/074335
PCT Pub. Date: Apr. 14, 2022

(65) Prior Publication Data
US 2023/0384250 A1    Nov. 30, 2023

(30) Foreign Application Priority Data
Oct. 9, 2020   (FR) ........................................ 2010329

(51) Int. Cl.
*G01N 27/04*  (2006.01)
*G01N 27/02*  (2006.01)

(52) U.S. Cl.
CPC .......... *G01N 27/041* (2013.01); *G01N 27/025* (2013.01)

(58) Field of Classification Search
CPC ...... G01N 27/041; G01N 27/025; F16L 53/37; H05B 2203/021; H05B 2203/022;
(Continued)

(56) References Cited

U.S. PATENT DOCUMENTS 9,285,402 B1 *   3/2016   Emery ................... G01R 27/16
10,852,224 B2 * 12/2020   Espejord ................ G01N 17/04
(Continued)

FOREIGN PATENT DOCUMENTS

EP   0375375 A1   6/1990
FR   3083841 A1   1/2020

OTHER PUBLICATIONS

Lervik, et al., "Electromagnetic Modelling of Steel Pipelines for DEH Applications", The Seventeenth International Offshore and Polar Engineering Conference, Paper No. 2007-JSC-563, Jul. 1, 2007, 5 pages.
(Continued)

*Primary Examiner* — Giovanni Astacio-Oquendo
(74) *Attorney, Agent, or Firm* — Workman Nydegger

(57) ABSTRACT

A method for determining the linear electrical resistance in AC mode of a steel pipeline, including the steps of generating in a portion of the pipeline an induced current by means of an induction coil centered on a longitudinal axis of the pipeline and traversed by an AC current. The coil is housed in a yoke made of ferromagnetic material in order to confine the magnetic field to a predefined surface of the pipeline portion, measuring the active power dissipated by the pipeline portion subjected to the magnetic field, measuring the amplitude of the produced magnetic field, and determining the linear electrical resistance in AC mode of the pipeline portion from the measurements of the dissipated active power and the amplitude of the induced magnetic field. A device is provided for implementing such a method.

13 Claims, 9 Drawing Sheets

(58) Field of Classification Search
CPC ...... H05B 3/58; H05B 2214/03; G01R 27/02; G01R 27/16
USPC ................................ 324/693, 691, 649, 600
See application file for complete search history.

(56) References Cited

U.S. PATENT DOCUMENTS

| | | |
|---|---|---|
| 2002/0105333 A1 | 8/2002 | Amini |
| 2004/0149443 A1 | 8/2004 | La Rovere et al. |
| 2017/0265771 A1* | 9/2017 | Udupa ................ G01R 35/005 |
| 2021/0301964 A1 | 9/2021 | Hallot |
| 2021/0373056 A1* | 12/2021 | Lyden ................ G01R 19/0053 |
| 2023/0012533 A1* | 1/2023 | Huang ................ G01R 35/005 |
| 2023/0273013 A1* | 8/2023 | Aykac .................... C25D 21/12 702/127 |

OTHER PUBLICATIONS

International Search Report from corresponding PCT Application No. PCT/FR2021/051737, Feb. 3, 2022.
Search Report from corresponding French Application No. FR 2010329, Jun. 1, 2021.

* cited by examiner

METHOD FOR DETERMINING THE LINEAR AC ELECTRICAL RESISTANCE OF A STEEL PIPE AND DEVICE FOR IMPLEMENTING SUCH A METHOD

TECHNICAL FIELD

The invention relates to the general field of the characterization of steel pipelines used for the transport of fluids, in particular oil and gas. It relates more specifically to a method for determining the linear electrical resistance in AC mode of a steel pipeline.

PRIOR ART

In the same offshore hydrocarbon production field, it is common to exploit several wells that can be separated from each other by several kilometers, even tens of kilometers. The fluids from these different wells must be collected by metal subsea pipelines (typically made of steel) laid on the seabed and transferred by bottom/surface connection pipelines towards a surface installation, for example a platform, a vessel or a land collection point, which will collect the fluids for storage (and possibly for treatment).

The fluids from the production wells tend to cool down quickly while traveling the many kilometers of subsea pipelines or during production shutdowns. However, if no provision is made to maintain a minimum threshold temperature inside these pipelines, there is a significant risk that the gas molecules, in particular methane, contained in the transported fluids combine with water molecules to form, at low temperature, hydrate crystals. These can stick to the walls, agglomerate there and lead to the formation of plugs capable of blocking the circulation of fluids inside the pipelines. Similarly, the solubility in oil of the high molecular weight compounds, such as paraffins or asphaltenes, decreases when the temperature drops, which gives rise to solid deposits which are also capable of blocking the circulation.

In the case of subsea pipelines called "single-shell" subsea pipelines, it is known to resort to an active heating solution. The most common solution consists in heating the subsea pipeline by the application of an AC electric current directly on the inner steel shell of the pipeline, this shell being connected to each end of the pipeline to an electric cable. The inner shell is not electrically isolated from the sea water in which the pipeline is immersed, leading to strong currents circulating in this sea water and greatly reducing the effectiveness of the solution.

In the case of subsea pipelines called "double-shell" subsea pipelines of the "Pipe In Pipe" or PIP type in which an inner shell transports the fluids and an outer shell coaxial with the inner shell is in contact with the sea water, it is also known to heat the inner shell of the pipeline by application of an AC electric current directly on the inner steel shell of the pipeline, the outer shell also made of steel being used as a conductor for the return path of the electric current.

The AC electric current which travels through the inner shell thus allows heating the latter by Joule effect. More specifically, the heating of the inner shell is produced by Joule effect by the current passing therethrough; the heat produced is largely transmitted to the fluids in the inner shell, the thermal losses through the insulator filling the annular space between the inner shell and the outer shell being relatively small. This electrical heating solution is called "Direct Electrical Heating" (or DEH).

Whatever the type of pipeline (single-shell or double-shell pipeline), it is necessary to make sure before commissioning that the linear heating power in operation will be sufficiently homogeneous throughout the pipeline. Indeed, the heating power of a pipeline section being equal to its electrical resistance in AC mode multiplied by the square of the effective current passing therethrough, a linear electrical resistance in AC mode out of tolerance on one of the sections of the pipeline will lead to a heating power out of tolerance under operating conditions.

The linear electrical resistance in AC mode of a steel pipeline depends on many factors and can vary from one pipeline section to another, particularly within the same manufacturing batch. Also, it appeared crucial to be able to determine the linear electrical resistance in AC mode upon receipt of batches of pipeline sections.

To this end, one of the known methods for measuring the linear electrical resistance in AC mode of the pipeline sections is based on the direct power supply at the two ends of each pipeline section by means of a dedicated electronic power source. Reference may be made in particular to the publication entitled "Electromagnetic Modelling for Electrical Heating of Pipelines" and published in 2007 by "International Society of Offshore and Polar Engineers" (ISOPE-I-07-378).

However, this method has many drawbacks, including a relatively long measurement cycle time (about 15 min for a 12 m long pipeline section). Moreover, this method requires a grinding of the pipeline section at the points of connection to the electronic power source. Furthermore, the equipment necessary for this measurement (particularly the power source) is quite bulky.

DISCLOSURE OF THE INVENTION

The object of the invention is therefore to propose a method for determining the linear electrical resistance in AC mode of a steel pipeline that does not have the aforementioned drawbacks.

In accordance with the invention, this aim is achieved by means of a method for determining the linear electrical resistance in AC mode of a steel pipeline, comprising the steps of:
a) generating in a portion of the pipeline an induced current resulting from the production of a magnetic field at a predefined frequency by means of an induction coil centered on a longitudinal axis of the pipeline and traversed by an AC current, the induction coil being housed in a yoke made of ferromagnetic material in order to confine the magnetic field to a predefined surface of the pipeline portion;
b) measuring the active power dissipated by the pipeline portion subjected to the magnetic field;
c) determining the amplitude of the produced magnetic field; and
d) determining the linear electrical resistance in AC mode of the pipeline portion from the measurements of the dissipated active power and the amplitude of the induced magnetic field.

The method according to the invention is remarkable in that it provides for determining the linear electrical resistance in AC mode (AC) of a pipeline portion by generating a magnetic field at a predetermined frequency capable of inducing a current in the thickness of the pipeline. It is in particular possible to perform a local measurement of the linear AC electrical resistance or to scan the entire pipeline by moving the induction coil along the pipeline. In this case, the time required to determine the linear AC electrical resistance can be considerably reduced compared to the method known from the prior art (typically 5 min for a 12 m long pipeline).

In addition, the method according to the invention does not require any grinding (or other operation) of the pipeline and the equipment necessary for its implementation is very space-saving. Furthermore, the method according to the invention allows performing a measurement of the linear AC electrical resistance both on the outer face of the pipeline and on its inner face.

Advantageously, the linear electrical resistance in AC mode of the pipeline portion is determined in step d) by the equation: $R_{AC\_DEH}=(2\times\Pi_{heat\_JIMP})/(\pi\times OD\times H_{JIMP})^2$; where $R_{AC\_DEH}$ is the linear electrical resistance in AC mode, $\Pi_{heat\_JIMP}$ is the active power dissipated per unit length of the pipeline, OD is the diameter of the pipeline, and $H_{JIMP}$ is the amplitude of the produced magnetic field.

Also advantageously, the frequency of the magnetic field produced in step a) can be varied continuously in order to determine the linear electrical resistance in AC mode of the pipeline portion at different frequencies.

According to one application, steps a) to d) are repeated over the entire length of the pipeline by moving the induction coil along the pipeline.

The induction coil of step a) can be disposed inside the pipeline in order to determine the linear AC electrical resistance of the inner face of the pipeline. Alternatively, it can be disposed outside the pipeline in order to determine the linear AC electrical resistance of the outer face of the pipeline.

The frequency of the magnetic field produced in step a) can be comprised between 5 Hz and 10 kHz.

The invention also relates to a device for implementing the method as defined previously, comprising an induction coil intended to be centered on a longitudinal axis of the pipeline and to be traversed by an AC current, and a yoke made of ferromagnetic material inside which the induction coil is mounted in order to confine the magnetic field to a predefined surface of the pipeline portion.

The yoke can comprise a tubular body concentric with the induction coil which terminates at each end in an annular collar delimiting an air gap with the portion of the pipeline.

The induction coil can be made by winding of a conductive wire with a variable pitch over the length of said induction coil in order to compensate for the edge effects. Alternatively, the induction coil can be made by winding of conductive wires in several layers over all or part of its length.

Preferably, the device further comprises means for minimizing the influence of the edge effects on the quality of the measurements. In this case, the device can thus comprise plates made of ferromagnetic material which are able to radially slide on each collar of the yoke in order to come into contact with the surface of the pipeline portion to minimize the influence of the edge effects on the quality of the measurements. Alternatively, the device can comprise laminated flexible blades made of ferromagnetic material which are positioned in a star configuration around the pipeline and at each end of the tubular body of the induction coil in order to come into contact with the surface of the pipeline portion to minimize the influence of the edge effects on the quality of the measurements.

DESCRIPTION OF THE EMBODIMENTS

The method according to the invention applies to any subsea pipeline (single-shell or double-shell pipeline) made of steel and intended to transport fluids such as oil and gas.

The method according to the invention applies more particularly to subsea pipelines made of steel (in particular but not exclusively carbon steel) which are subjected to an electrical heating of the "Direct Electrical Heating" (or DEH) type.

This type of electrical heating consists in applying an AC electric current to the shell to be heated. The heating of the shell is produced by the Joule effect by the current passing therethrough, the heat produced being largely transmitted to the fluids circulating in the shell.

Figure 1:
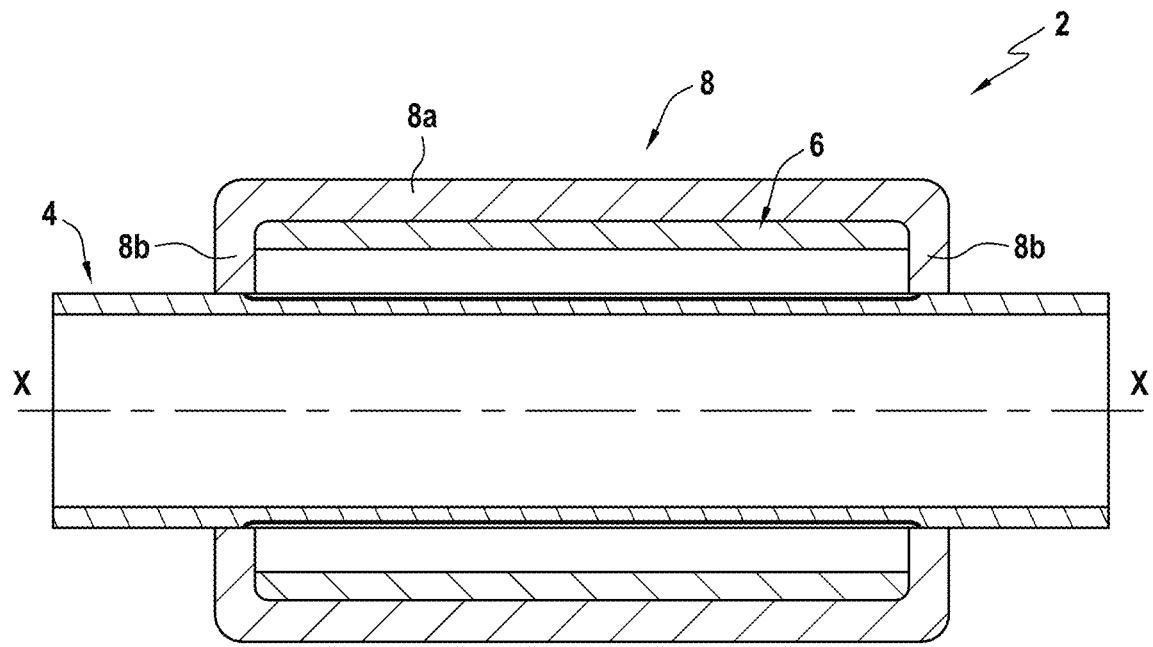
FIG. 1 is a schematic view of an example of a device for the implementation of the method according to the invention.
Figure 2:
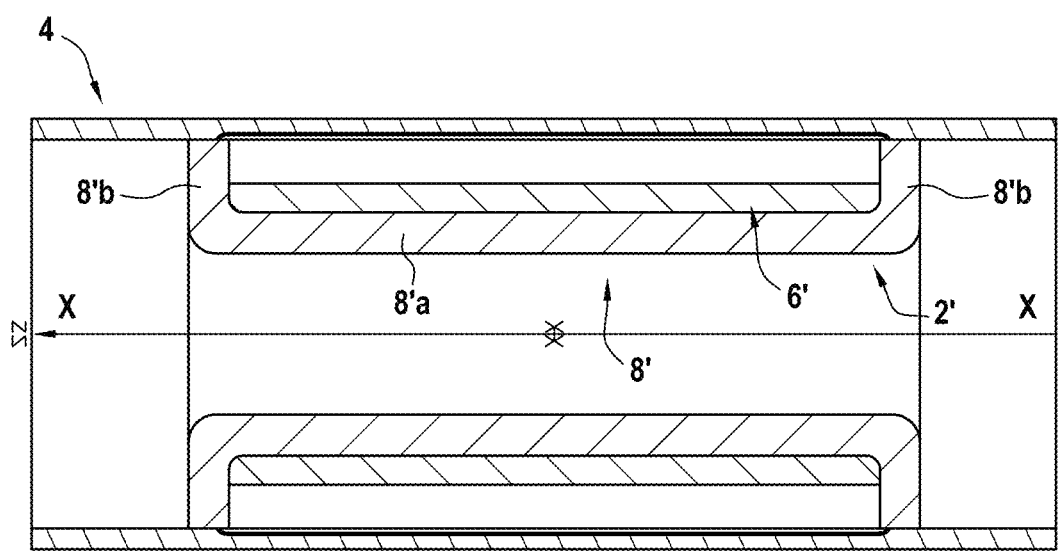
FIG. 2 is a schematic view of another example of a device for the implementation of the method according to the invention.

The method according to the invention aims to determine the linear electrical resistance in AC mode (AC) of such a pipeline by means of a device such as the one represented in FIGS. 1 and 2.

In these two embodiments, the device is formed by an assembly of an induction coil (or solenoid) intended to be powered by an AC current and of a yoke made of ferromagnetic material.

In the embodiment of FIG. 1, the device 2 according to the invention is disposed around a pipeline portion 4 (which can be the inner shell of a double-shell pipeline or the shell in the case of a single-shell pipeline) so as to determine the linear AC electrical resistance of the outer face of the pipeline portion.

The device comprises an induction coil 6 which is centered on the longitudinal axis X-X of the pipeline 4, and a yoke 8 made of ferromagnetic material inside which the induction coil 6 is mounted and which allows confining the field magnetic to a predefined surface of the pipeline portion.

More specifically, the yoke 8 comprises a tubular body 8a which is centered on the longitudinal axis X-X of the pipeline 4 and which ends at each longitudinal end in an annular collar (or cheek) 8b turned inwards. These collars 8b are positioned facing the outer face of the pipeline portion in order to confine the magnetic field produced by the induction coil in a delimited and predefined annular space, particularly over a precise length of the pipeline.

The yoke 8 is made of a ferromagnetic material, such as for example ferrite, or of laminated electric steel.

As for the induction coil 6, it is made by winding of a conductive wire, for example copper or aluminum, this winding can be single-layered or multilayered.

Moreover, in order to minimize the edge effects, the winding of the conductive wire can have a pitch that varies over the length of said induction coil with a greater conductive wire density at the two longitudinal ends of the tubular body 8a of the yoke than at its center. Alternatively, to obtain the same effect, the conductive wire winding can be done in several layers at these two longitudinal ends and be single-layered in the center.

In addition, the induction coil 6 is connected to an AC current source (not represented in the figures).

Finally, the device 2 according to the invention can include means for moving over the entire length of the pipeline in order to perform a measurement of the AC electrical resistance of the entire pipeline. These means, not represented in the figure, can comprise plastic pads or rollers disposed on the external face of the two collars 8b with the aim of centering the device on the pipeline while allowing an axial translation without excessive friction.

In the embodiment of FIG. 2, the device 2' according to the invention is disposed inside a pipeline portion 4 (which can be the outer shell of a double-shell pipeline) so as to determine the AC electrical resistance of the inner face of the pipeline portion.

Compared to the embodiment of FIG. 1, it results from this disposition that the yoke 8' comprises a tubular body 8'a which ends at each longitudinal end in collars 8'b turned outwards. These collars 8b are positioned facing the inner face of the pipeline portion and confine the magnetic field produced by the induction coil in a delimited and predefined annular space, particularly over a precise length of the pipeline.

As for the induction coil 6', it is similar to that of the embodiment of FIG. 1.

The method according to the invention is implemented by such a device 2, 2' and provides for the following steps.

The induction coil 6, 6' of the device is supplied with AC current at a predetermined frequency f. The power supply of the induction coil generates a magnetic field at a predefined frequency, this magnetic field inducing a current in the thickness of the pipeline portion subjected to the device according to the invention (on its inner face or its outer face).

More specifically, when the pipeline is excited by an induction coil JIMP of length $lg_{JIMP}$ and including n turns each traversed by a current i, an orbital current $I_{JIMP}$ develops by induction at the surface of the pipeline in a pipeline portion of length $lg_{JIMP}$ and of skin thickness $\delta_{JIMP}$ given by the following equation:

$$\delta_{JIMP} = \sqrt{\frac{\rho}{\pi \cdot f \cdot \mu}} \qquad \text{[Math. 1]}$$

In this equation, f is the frequency of the AC current, ρ is the electrical resistivity of the material of the pipeline, and μ is the magnetic permeability of the material of the pipeline.

The amplitude of the magnetic field $H_{JIMP}$ under the induction coil is theoretically constant and is given by the following equation:

$$H_{JIMP} = \frac{n \cdot i \cdot \sqrt{2}}{lg_{JIMP}} = \frac{I_{JIM} \cdot \sqrt{2}}{lg_{JIMP}} \qquad \text{[Math. 2]}$$

The active power $P_{heat\_JIMP}$ dissipated by the pipeline portion subjected to the magnetic field is given by the following equation:

$$P_{heat\_JIMP} = \rho \cdot \frac{\pi \cdot OD}{lg_{JIMP} \cdot \delta_{JIMP}} \cdot I_{JIM}^2 = \rho \cdot \frac{\pi \cdot OD}{lg_{JIMP} \cdot \delta_{JIMP}} \cdot \left(H_{JIMP} \cdot \frac{lg_{JIMP}}{\sqrt{2}}\right)^2 \qquad \text{[Math. 3]}$$

In this equation, OD is the diameter of the pipeline (i.e. the outside diameter of the pipeline if the device is disposed around the pipeline or the inside diameter of the pipeline if the device is disposed inside the pipeline).

It is deduced that the skin thickness $\delta_{JIMP}$ of the orbital current at the surface of the pipeline is given by the equation:

$$\delta_{JIMP} = \frac{\pi \cdot OD \cdot \rho \cdot H_{JIMP}^2}{2 \cdot \Pi_{heat\_JIMP}} \qquad \text{[Math. 4]}$$

In this equation, $\Pi_{heat\_JIMP}$ is the linear active power in the pipeline.

Moreover, the inventors have observed that, in the case of homogeneous and linear materials as in the case of non-linear ferromagnetic materials (such as carbon steel), for magnetic fields of the same amplitude, the skin depth of the orbital current which develops by the induction coil is the same as that of an axial AC current used to heat a pipeline according to the DEH (direct electrical heating) method.

However, for a pipeline heated by the DEH method, it has been established that the linear electrical resistance in AC current $R_{AC\_DEH}$ is given by the following equation:

$$R_{AC\_DEH} = \frac{\rho}{\pi \cdot OD \cdot \delta_{DEH}} \qquad \text{[Math. 5]}$$

Also, by substituting the skin thickness value $\delta_{JIMP}$ calculated previously in the expression above of the value of the linear electrical resistance in AC current $R_{AC\_DEH}$, the following equation is obtained:

$$R_{AC\_DEH} = \frac{\rho}{\pi.OD.\delta_{DEH}} = \frac{\rho}{\pi.OD.\delta_{JIMP}} = \frac{2.\Pi_{heat\_JIMP}}{(\pi.OD.H_{JIMP})^2} \quad \text{[Math. 6]}$$

The linear electrical resistance in AC current $R_{AC\_DEH}$ of the pipeline portion subjected to the magnetic field $H_{JIMP}$ is then given by the following equation:

$$R_{AC\_DEH} = \frac{2.\Pi_{heat\_JIMP}}{(\pi.OD.H_{JIMP})^2} \quad \text{[Math. 7]}$$

In this equation, $\Pi_{heat\_JIMP}$ is the linear active power in the pipeline and $H_{JIMP}$ is the amplitude of the magnetic field in the annular space comprised between the induction coil and the pipeline.

Figure 3:
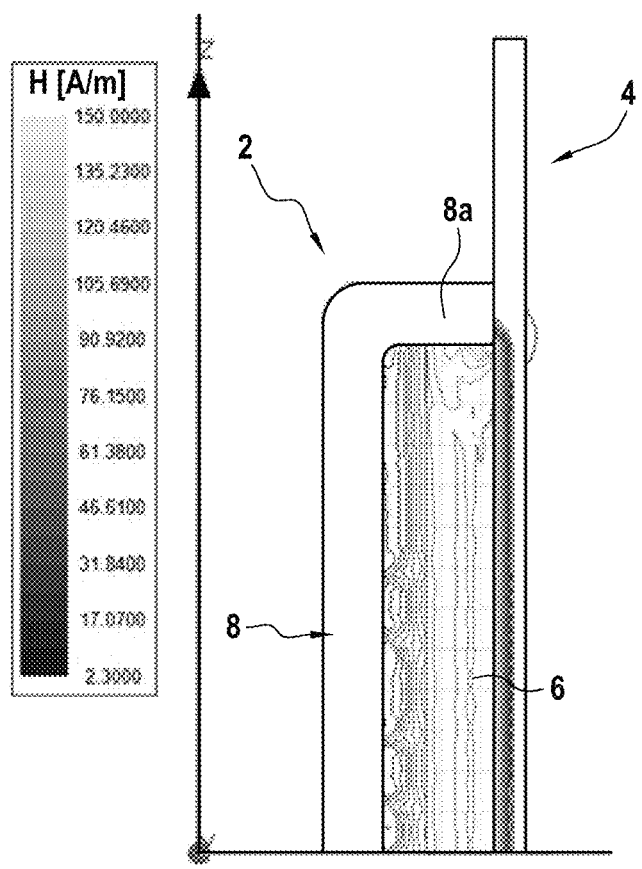
FIG. 3 represents an example of a distribution of the magnetic field produced during the method according to the invention in the induction coil and in a pipeline portion.

FIG. 3 shows an example of a distribution of the amplitude of the magnetic field H (measured in Weber) produced during the method according to the invention in a pipeline portion 4 and in the induction coil 6 of the device according to the invention, this magnetic field having been generated by means of a device according to the invention as described above.

The inventors have found that the smaller the distance between the collars 8b of the yoke 8 and the (inner or outer) face of the pipeline portion 4, the more effective the confinement of the magnetic field on the surface of the pipeline portion. Thus, in the example of FIG. 3 in which the air gap is close to 0, the amplitude of the magnetic field H is relatively homogeneous over the entire surface of the pipeline portion comprised between the two collars of the yoke of the device.

As described previously, in order to minimize any edge effects due to the clearance between the collars of the yoke and the pipeline portion, the winding of the conductive wire making up the induction coil of the device may have a greater density at the level of the two collars of the yoke of the device.

Figure 4:
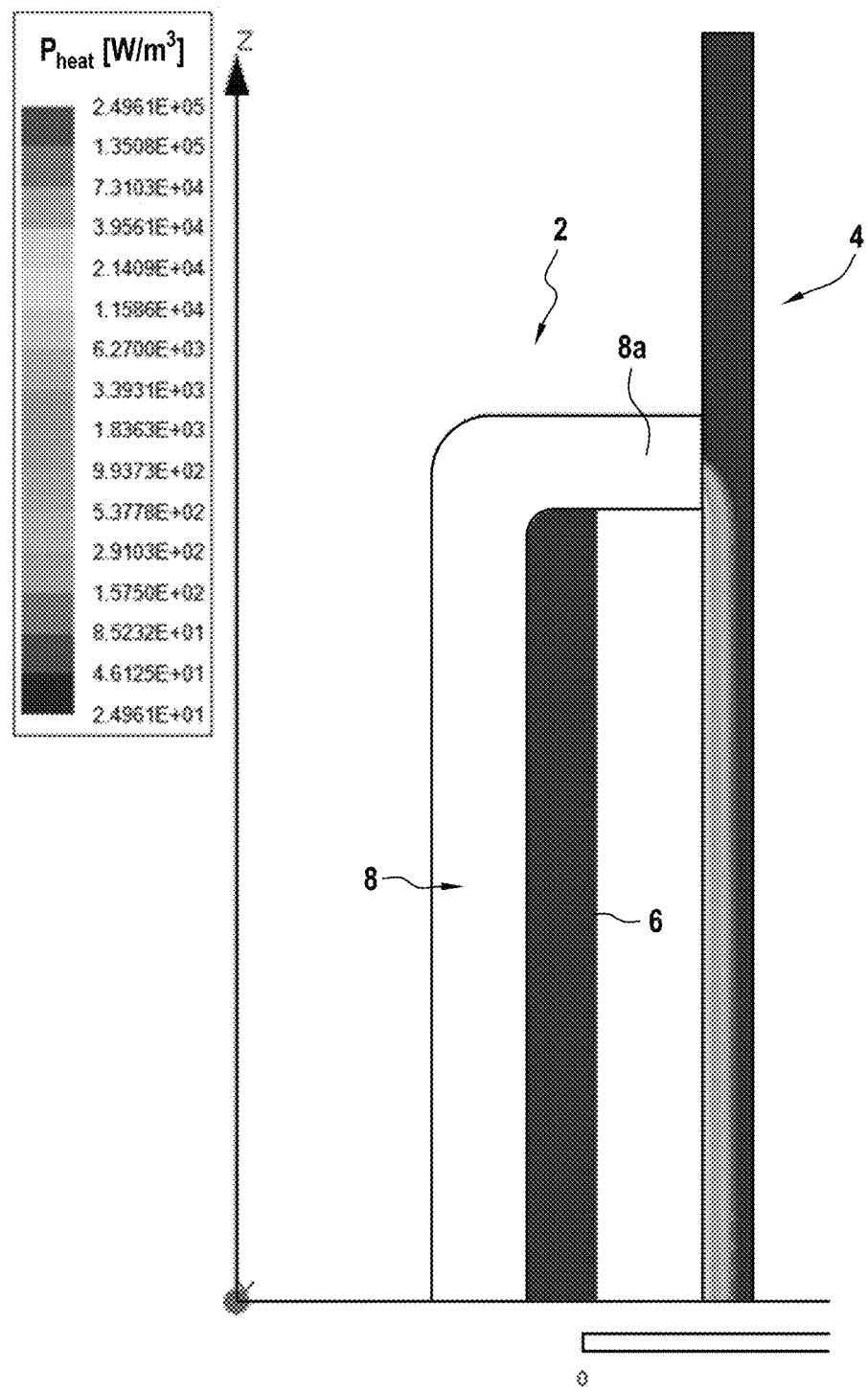
FIG. 4 represents an example of a distribution of the active power density dissipated in the induction coil and in a pipeline portion subjected to the method according to the invention.

FIG. 4 represents an example of a distribution of the active power density $P_{heat}$ dissipated (measured in W/m³) in the induction coil and in a pipeline portion subjected to the method according to the invention. This active power can be measured by means of an apparatus for measuring the active power, for example a network analyzer connected to the terminals of the induction coil.

Here again, it is observed that the dissipated active power is essentially concentrated in the pipeline portion subjected to the device according to the invention.

From these measurements, the method according to the invention provides for determining by calculation (see equation 6) the linear electrical resistance in AC mode $R_{AC\_JIMP}$ of the pipeline portion.

Figure 5:
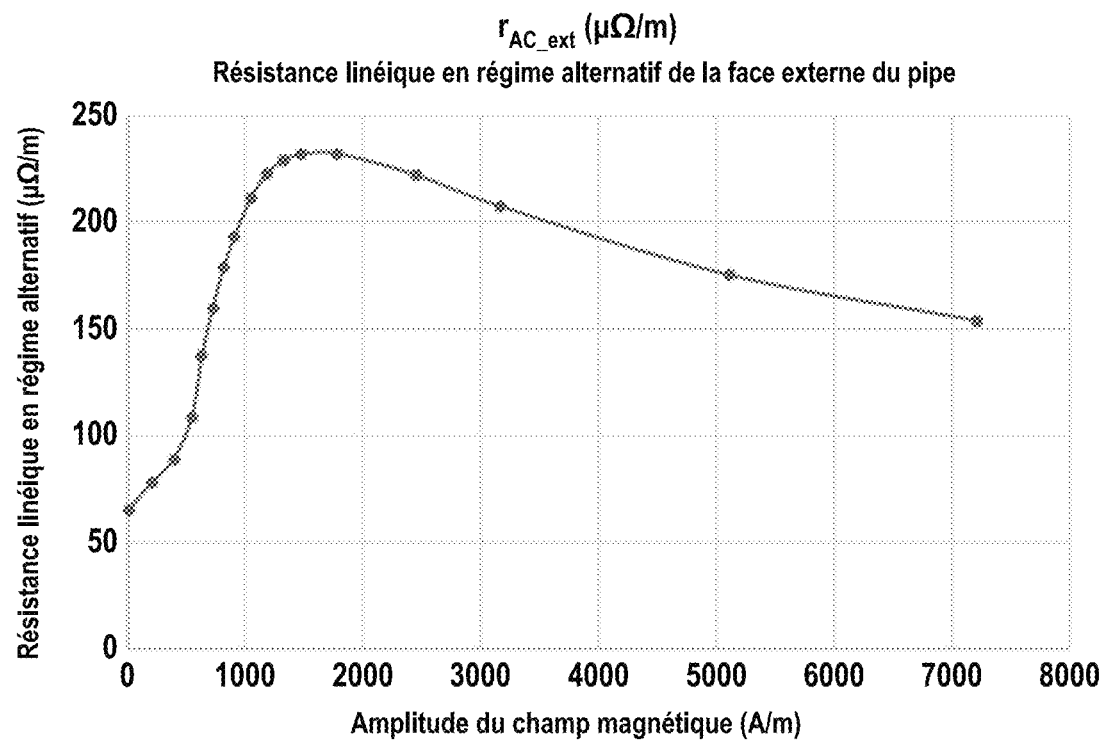
FIG. 5 is a curve showing an example of a linear electrical resistance in AC mode as a function of the amplitude of the magnetic field of the outer face of a pipeline portion subjected to the method according to the invention.
Figure 6:
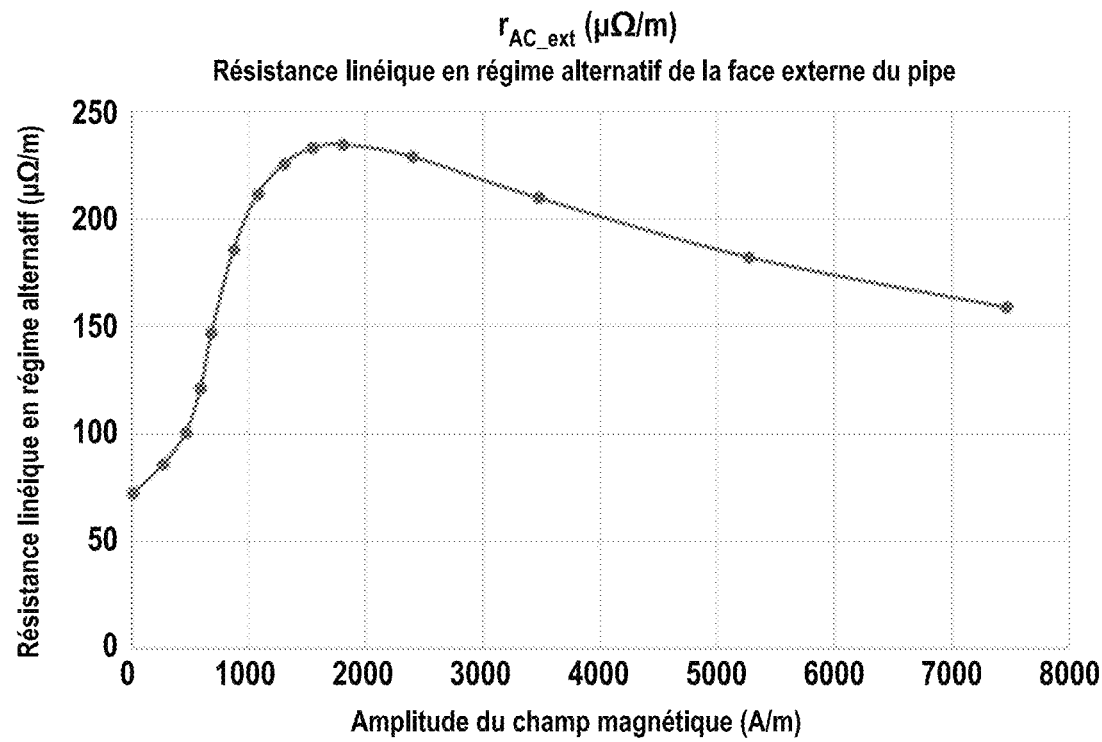
FIG. 6 is a curve showing an example of a linear electrical resistance in AC mode as a function of the amplitude of the magnetic field of the inner face of a pipeline portion subjected to the method according to the invention.

FIGS. 5 and 6 are examples of curves representing linear electrical resistances in AC mode (in µΩ/m) as a function of the amplitude of the magnetic field (in A/m), on the one hand for a device positioned outside the pipeline (FIG. 5—corresponding to the configuration of the embodiment of FIG. 2), and on the other hand for a device positioned inside the pipeline (FIG. 6—corresponding to the configuration of the embodiment of FIG. 1).

It will be noted that the determination of the linear electrical resistance in AC mode according to the method in accordance with the invention can be carried out over the entire length of a pipeline by moving the device along the longitudinal axis of the pipeline and by repeating the previously described steps.

It should also be noted that the linear electrical resistance in AC mode can be determined as a function of the skin depth by varying the frequency of the electric current supplying the induction coil. For example, by varying this frequency from 5 Hz to 10 kHz, it is possible to determine the linear electrical resistance of the pipeline from 0.1 mm to 20 mm of skin depth.

It will also be noted that the amplitude of the magnetic field $H_{JIMP}$ under the induction coil which is necessary to determine the linear electrical resistance in AC mode $R_{AC\_JIMP}$ of the pipeline portion can be measured by a probe or deduced from a measurement of the current i in the induction coil using the following equation: $H_{JIMP} = n \times i / lg$ where n is the number of turns of the induction coil and lg is its length.

Moreover, to minimize the influence of the edge effects on the quality of the measurement, the inventors have proposed several possible systems for closing the clearance that necessarily exists between the collars of the yoke and the pipeline portion whose dimensional tolerances may be wide. Indeed, this clearance degrades the confinement of the magnetic field in the air gap, and disturbs the magnetic flux circulating in the yoke and the pipeline.

Figure 7A:
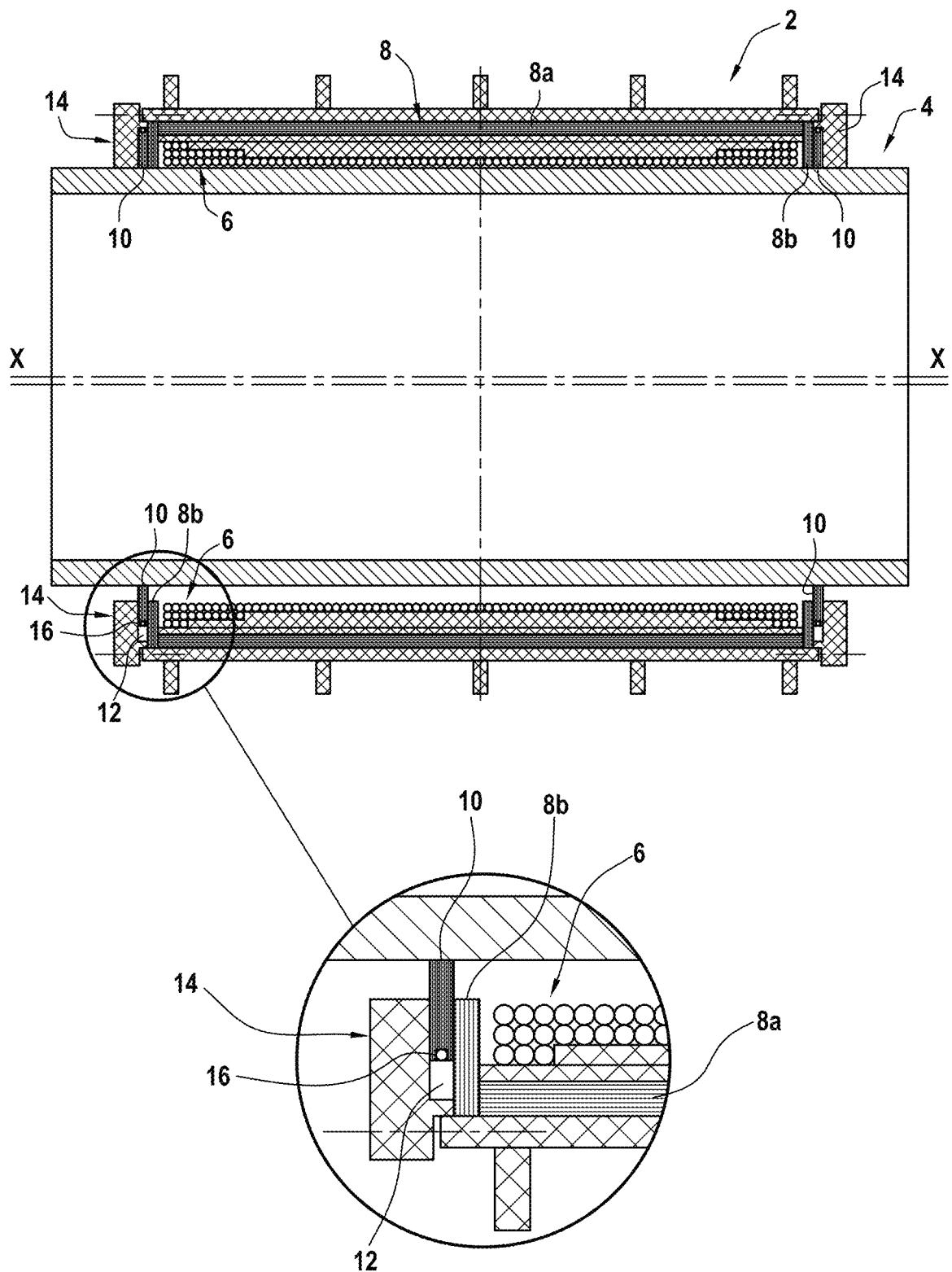
FIG. 7A represents in longitudinal section a variant of the device according to the invention provided with an example of a system to minimize the influence of the edge effects on the quality of the measurement.
Figure 7B:
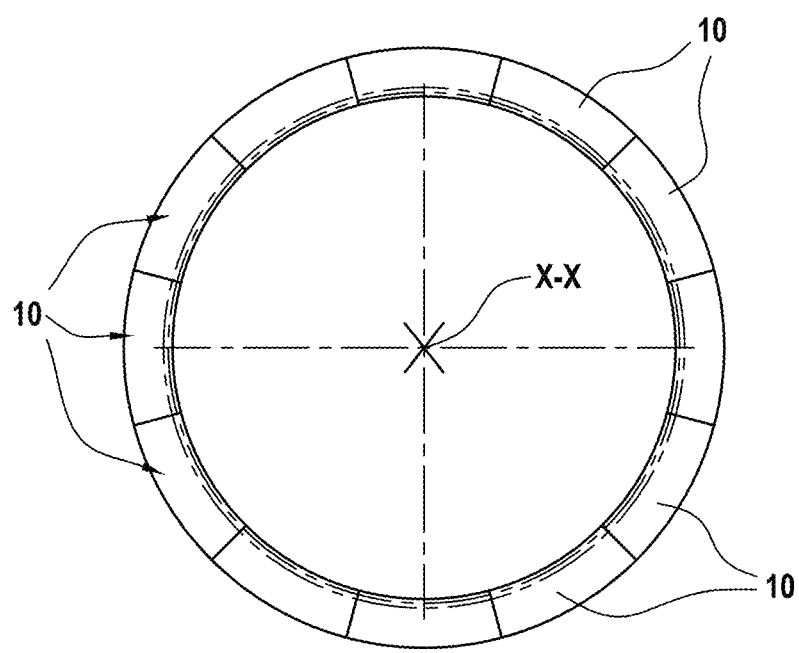
FIG. 7B is a cross-sectional view of the device of FIG. 7A.

FIGS. 7A and 7B represent one exemplary embodiment of a system to minimize the influence of the edge effects on the quality of the measurement. In this example, this system is based on the use of plates 10 made of ferromagnetic material which are able to slide radially on each collar 8b of the yoke 8 in order to come into contact with the surface (external surface here) of the pipeline portion. In this way, these plates 10 form a field bridge above the clearance existing between the collars of the yoke and the pipeline portion.

More specifically, the plates 10, for example twelve in number, form a ring when they are placed end to end about the axis X-X of the pipeline (see FIG. 7B). These plates are housed in an annular groove 12 delimited between the respective collars 8b of the yoke and annular flanges 14 (for example made of plastic) assembled against these collars. An O-ring 16 positioned around the plates 12 allows tensioning them in order to cause them to radially bear against the surface of the pipeline.

Figure 8A:
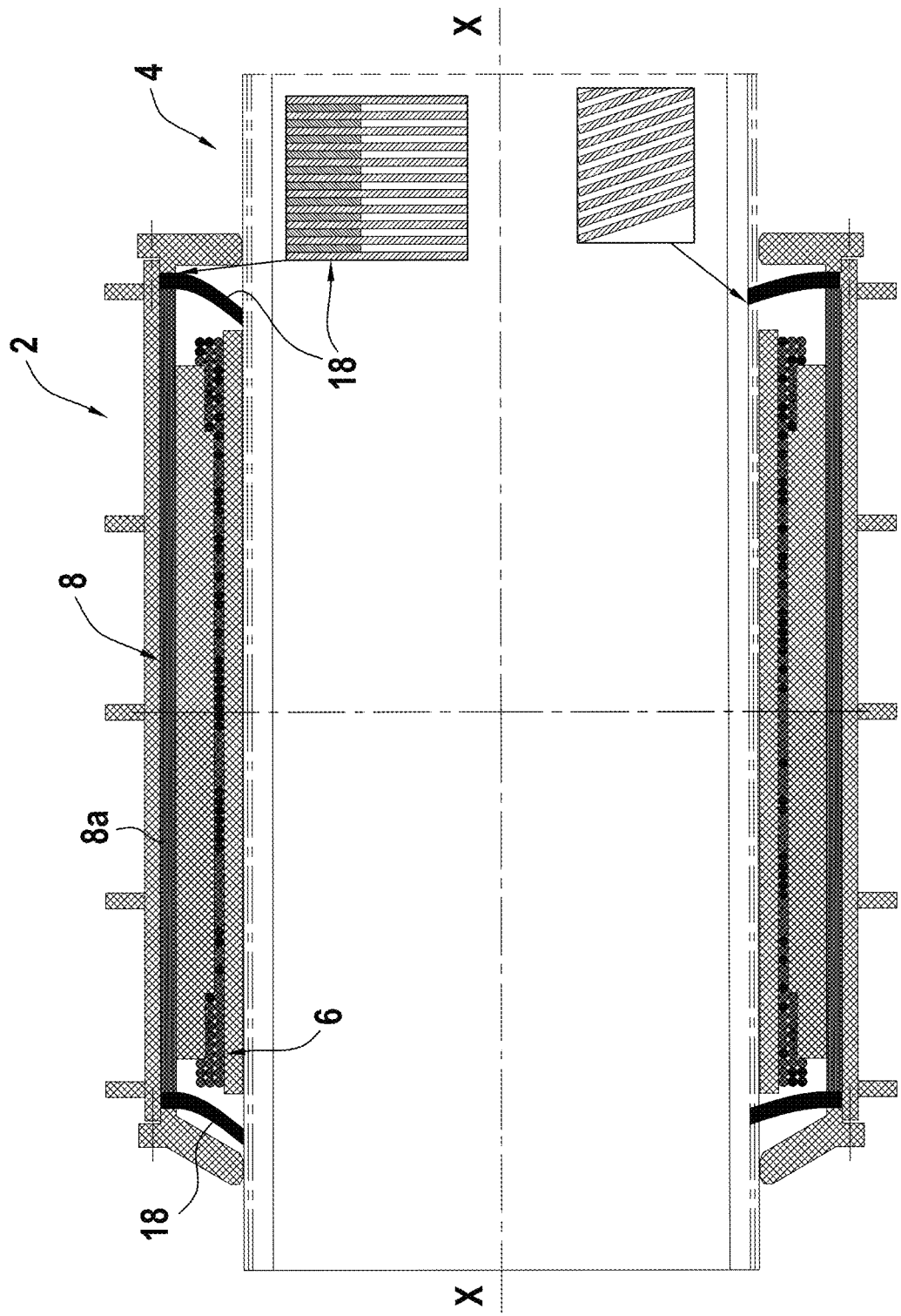
FIG. 8A represents in longitudinal section another variant of the device according to the invention provided with another example of a system to minimize the influence of the edge effects on the quality of the measurement.
Figure 8B:
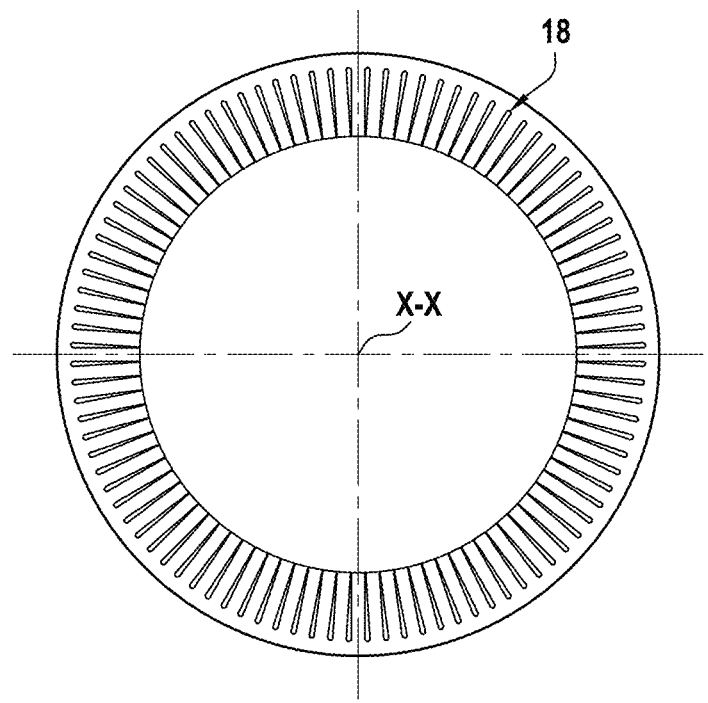
FIG. 8B is a cross-sectional view of the device of FIG. 8A.

Another exemplary embodiment of this system to minimize the influence of the edge effects represented by FIGS. 8A and 8B consists of the use of laminated flexible blades 18 made of ferromagnetic material which replace the collars of the yoke.

As represented in FIGS. 8A and 8B, these flexible blades 18 are positioned at each end of the tubular body 8a of the induction coil and in a star configuration around the pipeline in order to radially bear on its surface. The greater or lesser flexion of the blades allows absorbing the variable clearance as a function of the tolerances of the pipeline.

Figure 9:
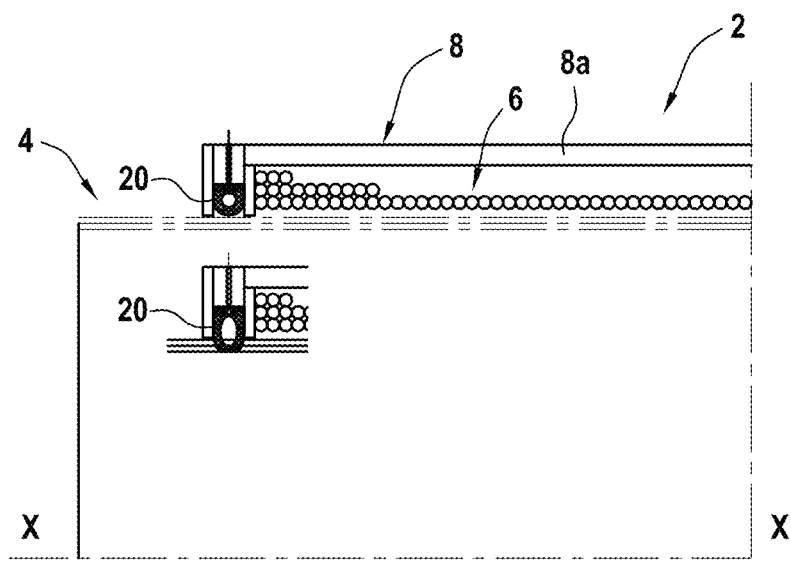
FIG. 9 represents a variant of the system of FIGS. 8A and 8B to minimize the influence of the edge effects on the quality of the measurement.

In one variant of this system represented in FIG. 9, the blades can be replaced by a ring 20 (or ring segments) made of ferromagnetic material which is inflatable. More specifically, as represented in the lower part of FIG. 9, the ring 20 is able to inflate in order to radially bear against the surface of the pipeline 4.

Figure 10:
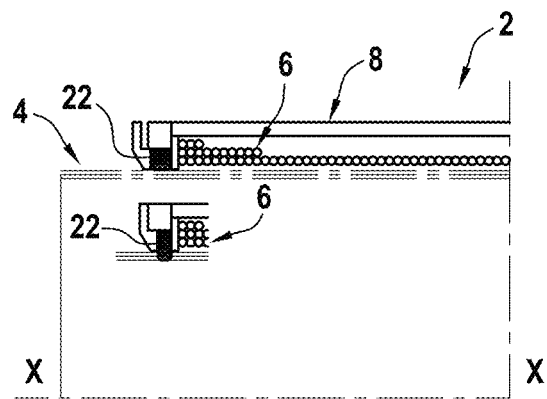
FIG. 10 represents another variant of the system of FIGS. 8A and 8B to minimize the influence of the edge effects on the quality of the measurement.

In another variant of this system represented in FIG. 10, the blades are replaced by a ring 22 (or ring segments) made of ferromagnetic material which is expandable. As represented in the lower part of FIG. 10, the ring 22 is able to expand in order to radially bear against the surface of the pipeline 4.

Figure 11:
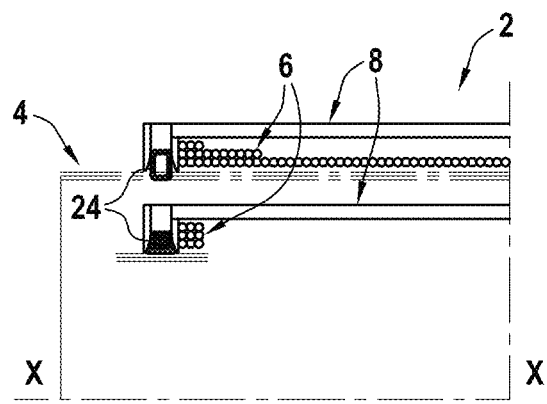
FIG. 11 represents yet another variant of the system of FIGS. 8A and 8B to minimize the influence of the edge effects on the quality of the measurement.

In yet another variant of this system represented by FIG. 11, the blades are replaced by a ring 24 (or ring segments) made of ferromagnetic material which is hollow and flexible. As represented in the lower part of FIG. 11, the ring 24 is able to be deployed in order to radially bear against the surface of the pipeline 4.

Figure 12:
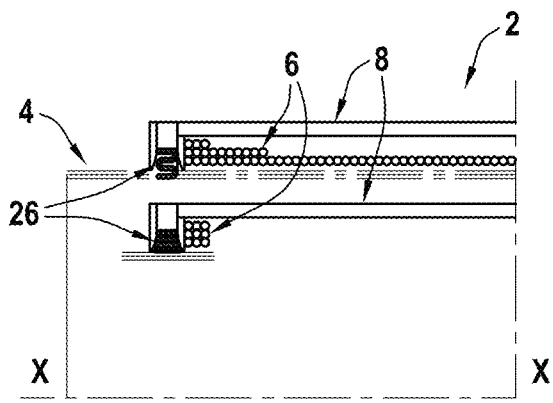
FIG. 12 represents yet another variant of the system of FIGS. 8A and 8B to minimize the influence of the edge effects on the quality of the measurement.

In yet another variant of this system represented by FIG. 12, the blades are replaced by a ring 26 (or ring segments) made of ferromagnetic material which is corrugated and flexible. As represented in the lower part of FIG. 12, the ring 26 is able to be deployed in order to radially bear against the surface of the pipeline 4.

The invention claimed is:

1. A method for determining a linear electrical resistance in AC mode of a steel pipeline, comprising the steps of:
   a) generating in a portion of the steel pipeline an induced current resulting from production of a magnetic field at a predefined frequency by means of an induction coil centered on a longitudinal axis of the steel pipeline and traversed by an AC current, the induction coil being housed in a yoke made of ferromagnetic material in order to confine the magnetic field to a predefined surface of the steel pipeline portion;
   b) measuring an active power dissipated by the steel pipeline portion subjected to the magnetic field;
   c) determining an amplitude of the produced magnetic field;
   d) determining the linear electrical resistance in AC mode of the steel pipeline portion from the measurements of the dissipated active power and the amplitude of the produced magnetic field, the linear electrical resistance in AC mode of the steel pipeline portion being determined in step d) by the following equation: $RAC\_DEH = (2 \times \Pi heat\_JIMP)/(\pi \times OD \times HJIMP)^2$; where RAC_DEH is the linear electrical resistance in AC mode, Πheat_JIMP is the active power dissipated by the steel pipeline per unit length, OD is the diameter of the steel pipeline, and HJIMP is the amplitude of the produced magnetic field; and
   e) commissioning the steel pipeline portion when the determined linear electrical resistance in AC mode of the steel pipeline portion is within a tolerance to provide homogeneous heating power throughout the steel pipeline.

2. The method according to claim 1, wherein the predefined frequency of the magnetic field produced in step a) varies in order to determine the linear electrical resistance in AC mode of the steel pipeline portion at different frequencies.

3. The method according to claim 1, wherein steps a) to d) are repeated over an entire length of the steel pipeline by moving the induction coil along the steel pipeline.

4. The method according to claim 1, wherein the induction coil of step a) is disposed inside the steel pipeline.

5. The method according to claim 1, wherein the induction coil of step a) is disposed outside the steel pipeline.

6. The method according to claim 1, wherein the predefined frequency of the magnetic field produced in step a) is comprised between 5 Hz and 10 kHz.

7. A device for implementing the method according to claim 1, comprising a subsea pipeline made of steel and intended to transport fluids including at least one of oil and gas, the induction coil intended to be centered on the longitudinal axis of the steel pipeline and to be traversed by the AC current, the yoke made of ferromagnetic material inside which the induction coil is mounted in order to confine the magnetic field to the predefined surface of a portion of the subsea steel pipeline, and an apparatus for measuring the active power connected to terminals of the induction coil to measure the active power dissipated by the subsea steel pipeline portion subjected to the magnetic field.

8. The device according to claim 7, wherein the yoke comprises a tubular body concentric with the induction coil which terminates at each end in an annular collar delimiting an air gap with the portion of the subsea steel pipeline.

9. The device according to claim 7, wherein the induction coil is made by winding of a conductive wire with a variable pitch over a length of said induction coil.

10. The device according to claim 7, wherein the induction coil is made by winding of conductive wires in several layers over all or part of a length of said induction coil.

11. The device according to claim 7, further comprising means for minimizing influence of edge effects on a quality of the measurement.

12. The device according to claim 11, comprising plates made of ferromagnetic material which are able to radially slide on each collar of the yoke in order to come into contact with the predefined surface of the subsea steel pipeline portion to minimize the influence of the edge effects on the quality of the measurement.

13. The device according to claim 11, comprising laminated flexible blades made of ferromagnetic material which are positioned in a star configuration around the subsea steel pipeline and at each end of a tubular body of the induction coil in order to come into contact with the predefined surface of the subsea steel pipeline portion to minimize the influence of the edge effects on the quality of the measurement.

* * * * *